United States Patent
Hou et al.

(10) Patent No.: US 11,581,957 B2
(45) Date of Patent: Feb. 14, 2023

(54) TESTING AND CALIBRATION OF PHASED ARRAY ANTENNAS

(71) Applicant: Intellian Technologies, Inc., Pyeongtaek-si (KR)

(72) Inventors: Peter Hou, Gaithersburg, MD (US); Xing-Xiang Liu, Rockville, MD (US); Bingqian Lu, Olney, MD (US); Ling Shen, Rockville, MD (US); Jogender Nagar, Montgomery Village, MD (US); Christopher Merola, Kirkland, WA (US)

(73) Assignee: INTELLIAN TECHNOLOGIES, INC., Pyeongtaek-si (KR)

( * ) Notice: Subject to any disclaimer, the term of this patent is extended or adjusted under 35 U.S.C. 154(b) by 72 days.

(21) Appl. No.: 17/350,312

(22) Filed: Jun. 17, 2021

(65) Prior Publication Data
US 2022/0407611 A1    Dec. 22, 2022

(51) Int. Cl.
*H04B 17/12*    (2015.01)
*G01R 29/10*    (2006.01)
*H01Q 3/26*    (2006.01)

(52) U.S. Cl.
CPC ........... *H04B 17/12* (2015.01); *G01R 29/105* (2013.01); *H01Q 3/267* (2013.01)

(58) Field of Classification Search
CPC ...... H04B 17/10; H04B 17/12; H04B 17/101; H04B 17/102; G01R 29/105; H01Q 3/24; H01Q 3/267
See application file for complete search history.

(56) References Cited

U.S. PATENT DOCUMENTS

| | | | |
|---|---|---|---|
| 2017/0110804 A1* | 4/2017 | Henry | H01Q 19/062 |
| 2017/0358420 A1* | 12/2017 | Liu | H01J 37/16 |
| 2018/0167105 A1* | 6/2018 | Vannucci | H04B 3/56 |
| 2018/0337738 A1* | 11/2018 | Wen | H04B 17/309 |
| 2021/0247325 A1* | 8/2021 | Ong | B33Y 40/00 |
| 2021/0255091 A1* | 8/2021 | Prystupa | G01N 21/25 |
| 2021/0302374 A1* | 9/2021 | Jack | G01N 29/11 |
| 2022/0192588 A1* | 6/2022 | Larson | A61B 5/4884 |

* cited by examiner

*Primary Examiner* — Thanh C Le
(74) *Attorney, Agent, or Firm* — Tutunjian & Bitetto, P.C.

(57) ABSTRACT

Testing apparatuses, and methods for using such apparatuses to calibrate and test an antenna, include a chamber that includes a lining, the lining being made from a material that is absorptive to radiation at a test wavelength. An adjustable platform is positioned at a first side of the chamber, the adjustable platform being rotatable to change an orientation of a device under test. A probe is positioned at a second side of the chamber, opposite to the first side of the chamber, that measures electromagnetic radiation from the device under test. A vector network analyzer communicates with the device under test and the probe to determine calibration information for the device under test.

20 Claims, 9 Drawing Sheets

TESTING AND CALIBRATION OF PHASED ARRAY ANTENNAS

BACKGROUND

The present invention relates to phased array antennas, and, more particularly, to testing and calibration of phased array antennas.

Near-field testing of phased array antennas can be performed by moving a probe from one antenna element to the next, performing measurements at each position. Amplitude and phase may be measured for each element, but the movement of the probe causes substantial delays for each element, consuming significant amounts of time for large arrays of elements.

Far-field testing can be performed with a probe that is far from the antenna. However, phase information is difficult to measure accurately in far-field arrangements, and it can be difficult to obtain per-element information. Even if one element is tested at a time, the large distance from the antenna array produces phase and amplitude measurement inaccuracies. Additionally, large testing chambers are needed to provide far-field measurements for many frequency ranges, making them expensive and unsuitable for calibration in the field.

BRIEF SUMMARY

A test apparatus includes a chamber that includes a lining, the lining being made from a material that is absorptive to radiation at a test wavelength. An adjustable platform is positioned at a first side of the chamber, the adjustable platform being rotatable to change an orientation of a device under test. A probe is positioned at a second side of the chamber, opposite to the first side of the chamber, that measures electromagnetic radiation from the device under test. A vector network analyzer communicates with the device under test and the probe to determine calibration information for the device under test.

A calibration method includes measuring first emissions from a phased array device using a first sub-array pattern, which divides elements of the phased array device into first sub-arrays. The elements of the phased array device are calibrated using the measured first emissions. Second emissions from the phased array device are measured using a second sub-array pattern, which divides the elements of the phased array device into second sub-arrays, each of the second sub-arrays partially overlapping with at least one of the first sub-arrays. The elements of the phased array device are calibrated using the measured second emissions.

A method for measuring an antenna pattern includes determining an excitation matrix for a phased array device by performing a calibration that sets values for each element of the phased array device, using a testing apparatus that is smaller than a far-field distance for an operational wavelength of the phased array device. An array factor is determined that sums each element's excitation. An active element pattern is determined. A far-field antenna pattern is calculated for the phased array device using the array factor and the active element pattern.

These and other features and advantages will become apparent from the following detailed description of illustrative embodiments thereof, which is to be read in connection with the accompanying drawings.

BRIEF DESCRIPTION OF THE DRAWINGS

The disclosure will provide details in the following description of preferred embodiments with reference to the following figures wherein.

DETAILED DESCRIPTION

Testing and calibration of a phased array antenna system can be performed without the need for a large anechoic chamber. As will be described in greater detail below, each antenna element may have a separate respective vector amplifier, which may tune the amplitude and phase of the antenna element's emissions. The various antenna elements in the phased array antenna system can be tuned to generate interfering radiation patterns, which can dramatically increase the gain of the radiation pattern and which can provide steering of the radiation pattern toward particular targets.

In one example, a phased array antenna system that occupies a 16"×16" antenna panel, operating at about 10GHz, may have a far-field distance of about 22m. Constructing a far-field anechoic chamber of that size to perform far-field measurements is expensive and impractical. Larger antenna systems, or systems operating at lower frequencies, may have even higher far-field distances. In contrast, such a phased array antenna system may be tested and calibrated, as described below, using a much smaller chamber that would otherwise be in the near-field of the antenna system's radiation pattern. Additionally, the phased array antenna system may be calibrated without any chamber at all, for example after the phased array antenna system has been deployed.

Figure 1:
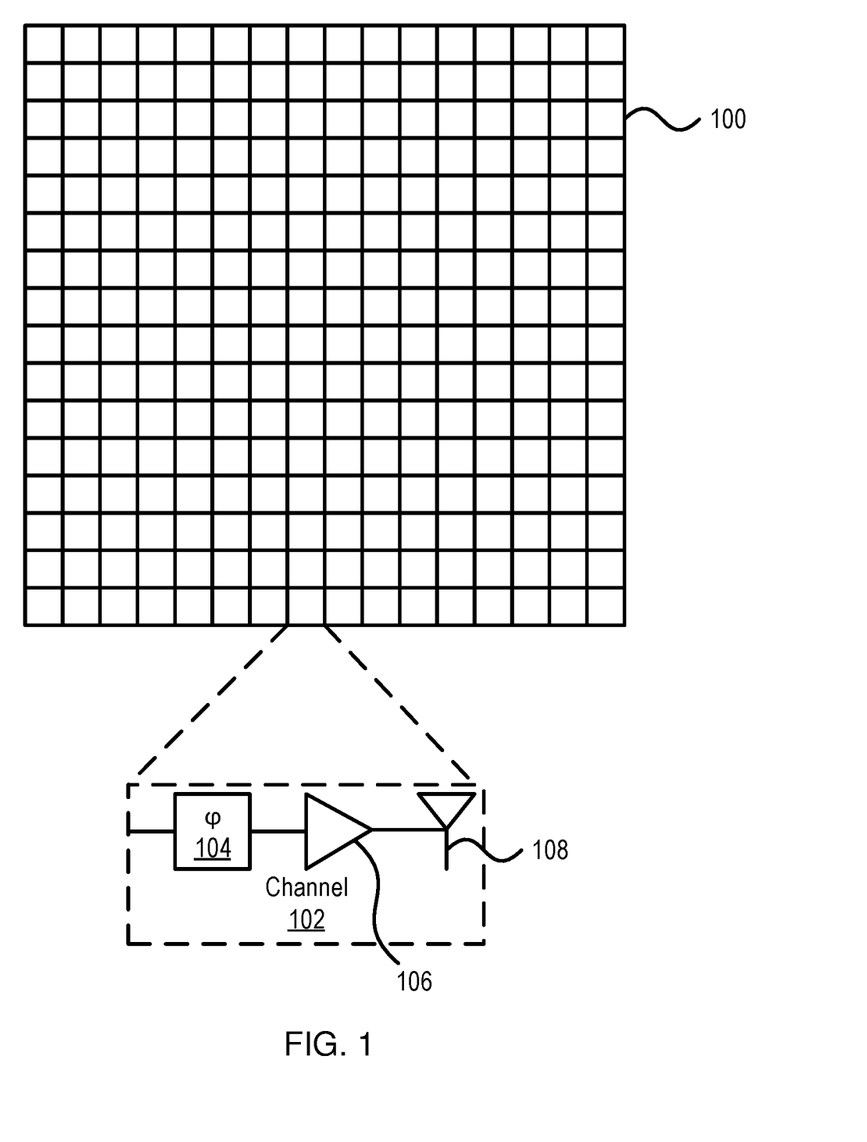
FIG. 1 is a block diagram of a phased array antenna system that includes multiple channels, in accordance with an embodiment of the present invention.

Referring now to FIG. 1, a phased array antenna system 100 is shown. The antenna system 100 includes multiple channels 102. In this example, sixty-four channels 102 are arranged in a 16×16 square grid, but it should be understood that the array may be made up of any appropriate number of channels, arranged in any pattern, with any dimensions. In some cases, the antenna system 100 may include an array of thousands of channels 102.

Each channel 102 includes an antenna element 108, and a vector amplifier that includes a phase shifter 104 and an amplifier 106. The phase shifter 104 is controllable to provide a variable phase shift of an input signal between, e.g., 0° and 360° or −180° and 180°. The relative phases between the channels can control the degree to which the respective radiation patterns constructively or destructively interfere with one another. The amplifier 106 is similarly controllable to adjust the gain of the signal. For example, the amplifier 106 may be able to provide a gain between 0dB and −20dB. The amplifier 106 may also provide a shutoff point (e.g., —∞dB). Each channel 102 may be separately controlled.

During manufacturing, there may be process variations that result in small variations in the effects of the phase shifter 104 and amplifier 106 of each channel 102. As a result, calibration may be needed to provide adjustments to the phase shift and gain to compensate for these variations, bringing all of the channels 102 to a uniform starting amplitude and phase. Additionally, changes to these components may occur over time to a deployed device, for example due to physical damage, corrosion, and environmental or temperature changes. As a result, calibration may need to be repeated upon installation, or afterward.

Calibration and testing that is performed before deploying the device can be performed in relatively controlled circumstances, with professional equipment and an anechoic chamber. Calibration that is performed after deployment of the device may be more limited, but can use equipment that is available in the field. For example, a phased antenna array system 100 that communicates with a satellite station may use the satellite station to provide signal strength information for transmissions that are sent in various configurations.

Figure 2:
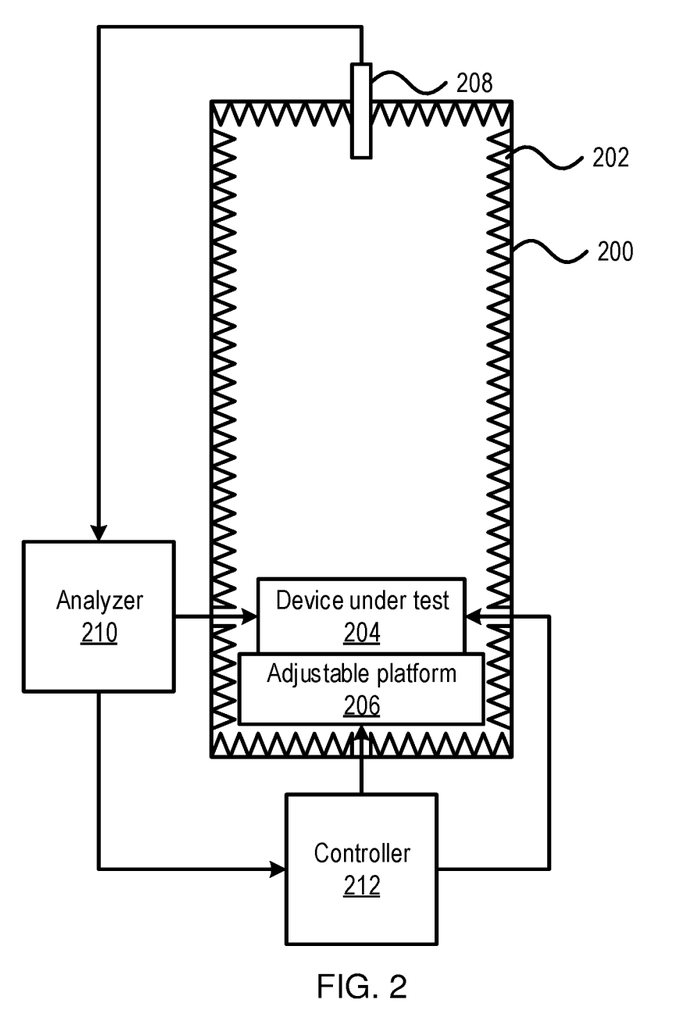
FIG. 2 is a block diagram of a testing chamber and system for a phased array antenna system, in accordance with an embodiment of the present invention.

Referring now to FIG. 2, a test system for a phased array antenna system is shown. The test system includes an anechoic chamber 200, which is designed to absorb reflections of electromagnetic radiation within a frequency range of interest. The anechoic chamber 200 may have a wall 202 that includes a structure or texture that minimizes reflections, formed from a material that absorbs radio frequency radiation, and may furthermore be lined with a conductive material, such as copper foil, to prevent external radiation from penetrating.

A device under test 204 may be the phased array antenna system that is being calibrated or tested. The device under test 204 may be positioned on an adjustable platform 206, for example implemented as a gimbal, which can pivot along multiple axes to provide testing of radiation from the device under test 204 at different scan angles. Thus, the adjustable platform 206 may rotate the device under test 204 in at least two degrees of freedom. The adjustable platform may help with scanning validation and calibration.

A probe 208 may be positioned at a fixed position in or on the anechoic chamber 200. The probe may be dual-polarized, so that it can measure both co-polarization radiation and cross-polarization radiation. During operation, the device under test 204 operates its channels 102 at various amplitudes and phases, as described below. The probe 208 measures the amplitude and phase at each configuration and scan angle, and outputs this information to an analyzer 210, such as a vector network analyzer.

The analyzer 210 can apply a precisely controlled amount of power to individual channels 102 of the device under test 204 while measuring the response of the power received at the probe 208, both in amplitude and phase, at each polarization. These measurements may be understood as S parameters, with S12 denoting the ratio of vector radio frequency power received at port 2 to the power transmitted at port 1. Thus, S12 represents a ratio of the power that is applied by the analyzer 210 to the device under test 204 to the power that is received at the probe 208. If the two polarizations of the probe 208 are connected to ports 2 and 3 of the analyzer 210, then S21 and S31 may be measured when the device under test 204 is in transmit mode, and S12 and S13 may be measured when the device under test 204 is in receive mode. The analyzer 210 may make such measurements rapidly, for example making hundreds or thousands of measurements per second. As a result, for a device under test 204 having 1,000 channels 102, each channel may be measured in less than a minute.

A controller 212 receives information from the analyzer 210 and makes calibration determinations. For example, if a received amplitude for a particular channel 102 is lower than expected, then a gain for the amplifier 106 of that channel 102 may be increased. If the phase measured for a particular channel 102 is different from expected, then the phase shift of the phase shifter 104 of that channel 102 may be adjusted. These calibration values may be stored on the device under test 204, for use during operation.

The controller 212 may furthermore control the position of the adjustable platform 206, for example changing the angle of the device under test 204 across multiple angle values in multiple axes, to take measurements of the channels 102 at different angles relative to the surface of the device under test 204.

Calibration may be performed at boresight (e.g., with the nominal phase of each channel 102 being set to zero, including any phase adjustments that have already occurred during calibration). With the adjustable platform 206, scan performance may be validated for the phased array antenna in the small chamber 200. For example, a new set of coefficients can be set for the channels 102 to scan to a known direction, and the adjustable platform 206 may be rotated to the same direction, within a range of error (e.g.,)±2°. This can help find the actual angle where the probe 208 receives the maximum power. Validation may then determine whether the maximum angle occurs within some predetermined range.

The adjustable platform 206 may also help with further scan angle calibrations. For small chambers, with a fixed probe and device under test, only the boresight scan can be characterized or calibrated. The adjustable platform 206 provides a degree of freedom in calibration. A process for calibrating an antenna that is not pointed to boresight is described in greater detail below.

Figure 3:
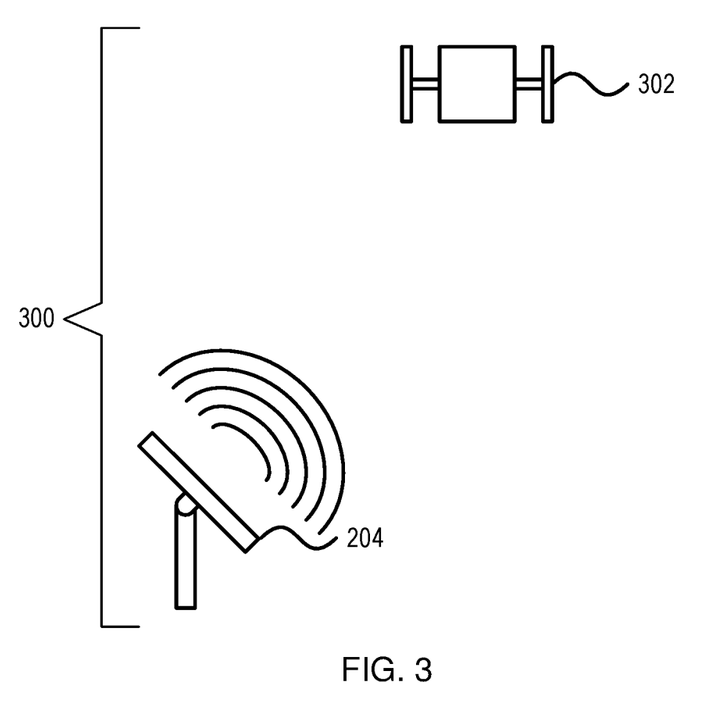
FIG. 3 is a diagram of a deployed phased array antenna system in communication with a satellite, in accordance with an embodiment of the present invention.

Referring now to FIG. 3, an alternative testing arrangement is shown. Rather than being confined to an anechoic chamber, the device under test 204 may be deployed in the field. The device under test 204 may be installed in any appropriate location, such as at the top of a land vehicle, on a building, or on a ship at sea, and may be inconvenient to access. Additionally, replicating lab conditions for testing a deployed device may be difficult or impossible, and specialized equipment such as an anechoic chamber may be unavailable.

In such cases, where calibration may nonetheless be desirable, the performance of the channels 102 of the device under test 204 may be evaluated using communications to a satellite 302 or other appropriate transceiver device. The testing system 300 then includes the device under test 204 and the satellite 302. Being positioned in the far field, the satellite 302 may be limited to power measurements, for example as a signal strength measurement. Furthermore, more phase state measurements may be needed to obtain maximum and minimum power values, which may result in longer calibration times than would be possible in a lab.

Phased array antenna systems are of particular utility in situations where the other station is in motion, such as when the satellite 302 is in low Earth orbit or medium Earth orbit. In these cases, the satellite 302 will appear to move across the sky. By changing the beam direction, the phased array system can track the satellite 302 without physically moving.

Figure 4:
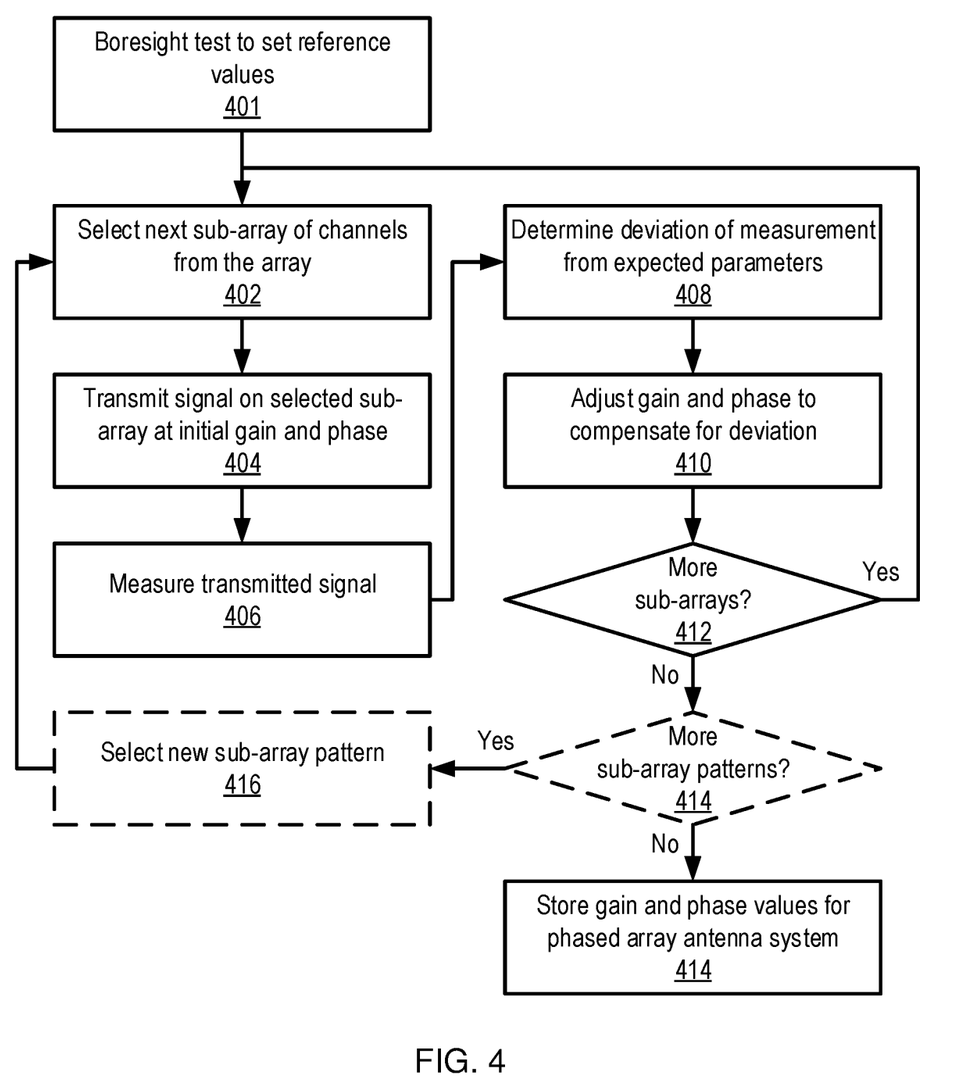
FIG. 4 is a block/flow diagram of a method for calibrating a phased array antenna system using sub-array measurements, in accordance with an embodiment of the present invention.

Referring now to FIG. 4, a method for calibrating a phased array antenna system 100 is shown. All of the channels 102 of a phased array antenna system 100 may be turned off, except for one. The single powered channel may be tested and calibrated, and the remaining channels may then be tested, one at a time, until all of the channels 102 of the system 100 are calibrated. In some cases, a sub-array of channels may be turned on at once.

Block 401 performs an initial boresight test to set reference values for the phase and amplitude of the channels 102. This initial boresight test is performed with the phase of each channel being set to zero, with an equal amplitude.

Block 402 selects a first sub-array of the channels 102. In some cases, the sub-array may be a single channel, while in other cases the sub-array may include a set of neighboring channels. For example, consider an exemplary array of sixteen channels, each channel being identified according to its respective row and column:

| 1,1 | 1,2 | 1,3 | 1,4 |
|-----|-----|-----|-----|
| 2,1 | 2,2 | 2,3 | 2,4 |
| 3,1 | 3,2 | 3,3 | 3,4 |
| 4,1 | 4,2 | 4,3 | 4,4 |

In a first example of a sub-array pattern, a first sub-array may include channels (1,1), (1,2), (2,1), and (2,2). A second sub-array may include channels (1,3), (1,4), (2,3), and (2,4), and so on, selecting different combinations of neighboring elements until the full set of channels 102 has been covered. Sub-arrays may overlap one another.

In a second example, a first sub-array may include channels (1,1), (1,2), (1,3), and (1,4), representing a row, or (1,1), (2,1), (3,1), (4,1), representing a column. An entire row or column may be activated at once, or portions of a row or column may be used.

In a third example, a sub-array may include channels (2,2), (2,3), (3,2), and (3,3). Notably, this third example overlaps with the channels of the sub-arrays of the first example pattern. While these examples are described with all of the channels of each sub-array being neighbors, it should be understood that the channels of a sub-array may also be separated.

The sub-arrays can be selected according to different sub-array tiling patterns. In the first example of a sub-array pattern, a set of sub-arrays covers the four quadrants of the example array without overlap. In the third example of a sub-array pattern, a sub-array is positioned in the middle of the array, overlapping the corners of four different sub-arrays from the first pattern example. Multiple different patterns may be used in succession, so that the calibrated values of each channel may depend on channels outside their own neighborhood. Although 2×2 sub-arrays are specifically contemplated herein, it should be understood that sub-arrays of other sizes may be used instead.

A signal is transmitted on the first channel at an initial gain and phase at block 404, and the transmitted signal is then measured, for example by probe 208, at block 406. When using a sub-array of multiple channels, all of the channels of the sub-array may be turned on for each measurement. The received signal strength and phase may be compared to expected values at block 408 to identify deviations from the expected parameters. The initial gain and phase for the channels of the sub-array may be adjusted, using the respective amplifier 106 and phase shifter 104 of the channels.

If more channels or sub-arrays remain to be tested at block 412, then processing may return to block 402, where a next channel or sub-array may be selected from the channels 102. For example, the next sub-array may be another sub-array with channels that have not already been tested. In any given pass, the sub-arrays may be without repeating the test for channels, until as many channels have been tested as can be without repetition.

In embodiments which use sub-arrays of multiple channels, multiple different sub-array patterns may be tested to promote interdependency between channels. Thus, blocks 414 and 416 are optionally performed to change between sub-array patterns. If all of the possible channels 102 have been tested for a particular sub-array pattern, then block 414 determines whether there are more sub-array patterns to test. If so, block 416 selects a new sub-array pattern, and processing returns to block 402 to begin testing sub-arrays within the new sub-array pattern. The new sub-array pattern may have sub-arrays that partially overlap with the sub-arrays of a previous sub-array pattern, such that calibration is repeated for at least some channels along with channels that were not previously considered together.

If there are no more sub-array patterns to test, then block 313 stores the gain and phase values for channels 102 of the phased array antenna system. The gain and phase values may be stored in a memory of the phased array channel system 100, and may be stored in an external memory of an antenna controller. In some cases, less than all of the channels 102 may be tested, for a partial test or calibration.

Figure 5:
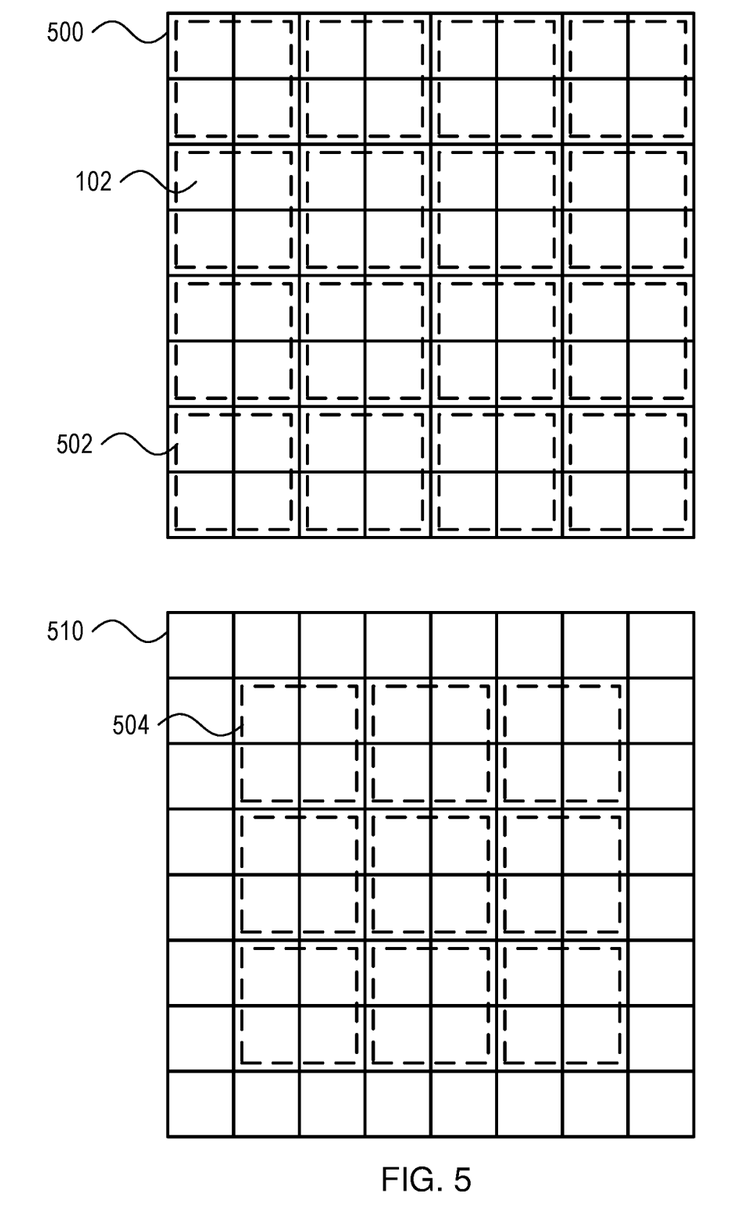
FIG. 5 is a diagram that compares different patterns of sub-arrays, in accordance with an embodiment of the present invention.

Referring now to FIG. 5, a comparison of different sub-array patterns is shown. A first sub-array pattern 500 is shown with first sub-arrays 502 that divide up the channels 102. In this pattern, all of the channels 102 are covered, and there is no overlap between the different sub-arrays 502. In a second sub-array pattern 510, the second sub-arrays 504 are shown as being shifted relative to the first sub-arrays 502. Notably, this second sub-array pattern 510 may not fully cover all of the channels 102.

As noted above with respect to FIG. 4, the first sub-arrays 502 of the first pattern 500 may be tested before any of the second sub-arrays 504 are tested. The overlap between the second sub-arrays 504 and the first sub-arrays 502 provides improved calibration, as local deviations may be corrected. For example, if a single channel 102 is particularly far out of phase with respect to its neighbors, that single channel 102 might distort the calibration of its entire sub-array 502 in the first pattern 500, but that deviation would be diminished for its neighbors in the second pattern 510.

Thus, for an array I, where each element $I_{mn}$ is indicated by a row index m and a column index n, the amplitude and phase values of each element in I may be initialized to a starting value. Grouping four channels 102 as first sub-arrays 502, according to the first pattern 500, blocks 402-410 turn on one sub-array 502 at a time and measure the complex power P1 at the probe 208. For every element in the sub-array 502, the appropriate entries of $I_{mn}$ may be multiplied by conj $$\left[P1\left(\frac{|P1|}{4}\right)\right],$$

where conj{·} is the complex conjugate. This may be repeated for each first sub-array 502 in the array, until every possible first sub-array 502 in the first pattern 500 has been measured.

The channels 102 may then be grouped as second sub-arrays 504, according to the second pattern 510. One sub-array 504 may be turned on and a complex power P2 may be measured at probe 208. For every element in the second sub-arrays 504, the appropriate entries of $I_{mn}$ may be multiplied by conj $$\left[P2\left(\frac{|P2|}{4}\right)\right].$$

This may be repeated for each second sub-array 504 in the array, until every possible second sub-array 504 in the second pattern 510 has been measured.

The measurement and calibration may switch back and forth between the two patterns multiple times. Furthermore, additional patterns may also be used. The calculated complex excitation for a channel at row m and column n is then given by $I_{mn}$. The complex excitation for a channel captures the phase and amplitude calibration values and may be expressed as a complex number, a+jb, where j is the square root of −1. The amplitude for a channel may then be expressed as $\sqrt{a^2+b^2}$ and the phase may be expressed as arctan(b/a).

Figure 6:
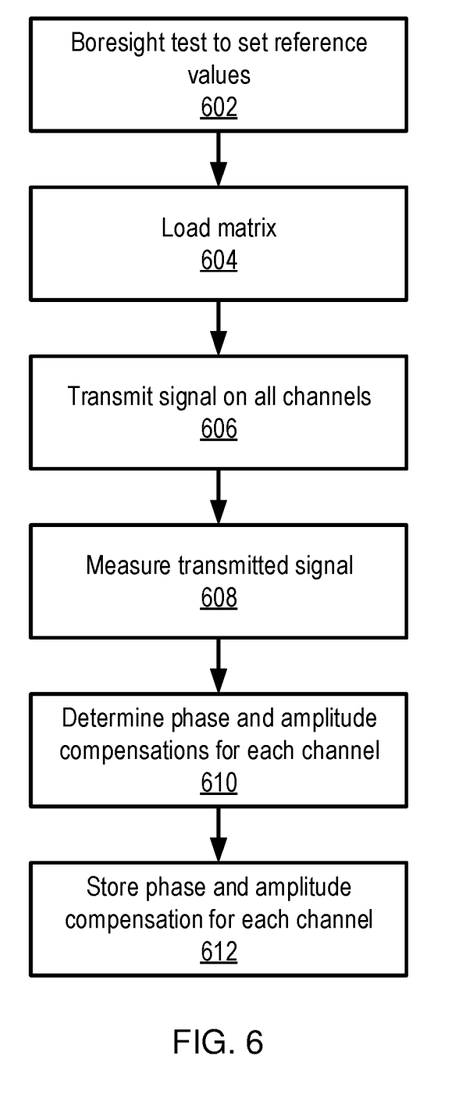
FIG. 6 is a block/flow diagram of a method for calibrating a phased array antenna system using full-array measurements, in accordance with an embodiment of the present invention.

Referring now to FIG. 6, a method for calibrating a phased array antenna system 100 is shown. All of the channels 102 of a phased array antenna system 100 may be turned on at once, with multiple measurements being used to calculate phase and amplitude compensation values for each channel 102. This approach is most accurate when the number of antenna elements 108 is a multiple of 2, 3, or 5. Block 602 generates reference values using a boresight test.

In one example of this embodiment, Hadamard matrices may be combined to generate a calibration matrix. If the phased array has N elements, then the number of measurements, and phase assignments, may also be N. By using matrix inversion, the complex weights for each channel 102 can be determined. The weights will include unequal path logs to the probe 208 if the probe 208 is not in the far field. In this case, a spatial power loss can be determined from the complex weights. For example, the Hadamard matrices may be expressed as:

$$H_2 = \begin{bmatrix} 1 & 1 \\ 1 & -1 \end{bmatrix}, H_3 = \begin{bmatrix} 1 & 1 & 1 \\ 1 & e^{\frac{j5\pi}{8}} & e^{\frac{j11\pi}{8}} \\ 1 & e^{\frac{j5\pi}{4}} & e^{\frac{j5\pi}{8}} \end{bmatrix}, H_5 = \begin{bmatrix} 1 & 1 & 1 & 1 & 1 \\ 1 & -1 & 1 & 1 & -1 \\ 1 & 1 & -1 & -1 & -1 \\ 1 & 1 & 1 & -1 & 1 \\ 1 & -1 & -1 & 1 & 1 \end{bmatrix}$$

A recursive multiplication of these Hadamard matrices can be used to reach a designed dimension for the array, thereby creating the calibration matrix H. Block 604 determines the calibration matrix H in this manner.

Block 606 transmits a signal on all of the channels 102 at once, using the calibration matrix. For example, the first row may be the first set of phase assignments for all N elements of the array, where 1 indicates a phase of 0°, and −1 indicates a phase of 180°. This measurement may be repeated N times in block 608 to generate a one-dimensional array of results S. The complex weights for the matrix of channels I can be solved by matrix inversion, for example as I=S* H⁻¹, in block 610. Block 612 stores these determined phase and amplitude values.

If the phased array antenna system includes N elements, then the matrix I may have dimensions of N×N. Each column of the matrix I would include values for every one of the N elements of the array. To solve the excitation of each element of phased array antenna system, the matrix I may be interpreted as N rows, each representing a different linear combination of the N elements. The values of the N elements may then be solved using the N equations.

Figure 7:
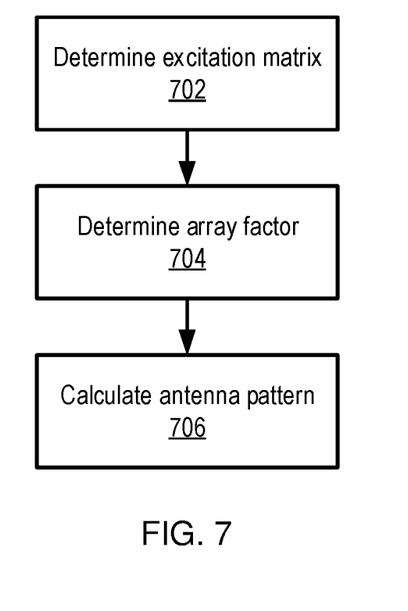
FIG. 7 is a block/flow diagram of a method of calculating a far-field antenna pattern using an array factor, in accordance with an embodiment of the present invention.

Referring now to FIG. 7, a method for calculating the antenna pattern is shown. In some cases, only an antenna pattern is needed to verify that the device under test is operating correctly. A far-field antenna pattern can be determined in the following manner using chamber that is small relative to the far-field distance. This can also be used for calibration, as a well-behaved far-field radiation pattern that meets system specifications will generally conform well to well-calibrated values of the device.

In some embodiments, the far field antenna pattern may be determined by calculating an array factor. The excitation matrix I, which includes the complex excitations for each channel as $I_{mn}$, may be determined by any appropriate calibration process, such as by the methods of FIGS. 4 and 6, in block 702.

The array factor may be calculated in block 704 by summing every channel's excitation, for example as:

$$AF(\theta, \phi) = \sum_{n=1}^{N}\sum_{m=1}^{M} I_{mn} e^{j(m-1)(kd_x \sin\theta\cos\phi)} e^{j(n-1)kd_y \sin\theta\sin\phi}$$

where $I_{mn}$ is the calculated complex excitation for the element in row m and column n, k=2π/λ is the wavenumber of a transmission, λ is the wavelength of the transmission, $d_x$ and $d_y$ are inter-element spacings in x and y, respectively, and θ and ∅ are the far-field angles in spherical coordinates. The total pattern (TP) also includes a contribution from the active element pattern (AEP). The far-field pattern is given by TP=(AF)(AEP) in block 706. The AEP may be determined from a simulation of the antenna pattern or may be calculated from a known-good device that is calibrated and measured, whether in a near-field or far-field chamber, and may then be determined from the far-field pattern and array factor of the known-good device. This information may be used during initial testing, for example to determine whether the device passes an acceptance test for regulatory purposes.

Figure 8:
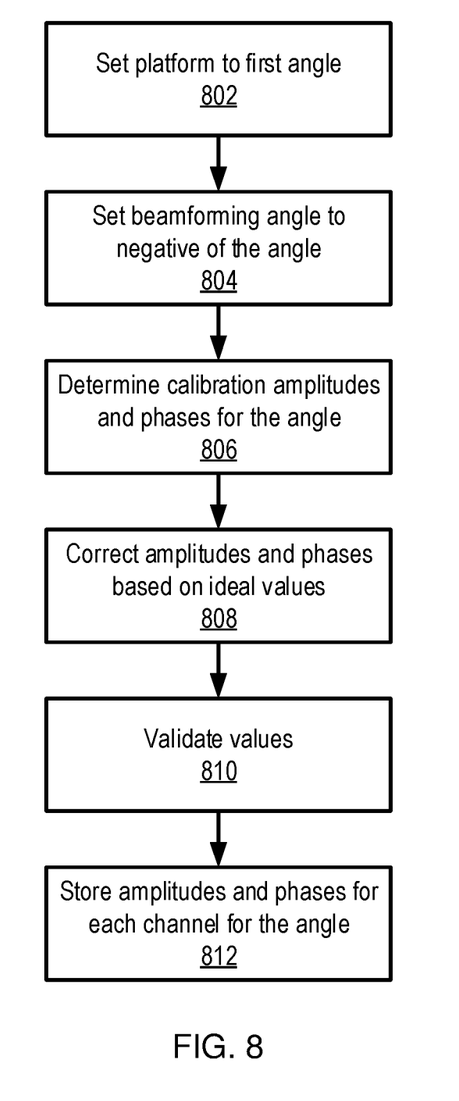
FIG. 8 is a block/flow diagram of a method of scanning different transmission angles using an adjustable platform for a device under test, in accordance with an embodiment of the present invention.

Referring now to FIG. 8, a method of calibration at angles other than boresight is shown. Block 802 sets the platform 206 to a first angle, measured as a deviation from a boresight angle. Block 804 then determines a beamforming angle for the device under test, for example by determining a phase shift and amplitude of each of the channels 102 to direct the beam pattern at an angle that is the negative of the angle for the platform 206. Block 804 then sets the calculated phases and amplitudes for the channels 102 to direct the energy of transmissions from the device under test toward the probe 208.

Block 806 uses any appropriate method to measure and correct the amplitudes and phases of the channels 102, such as those described above with respect to FIGS. 4 and 6. Block 808 may provide a correction to these determined values, based on the ideal predicted values. For example, as the source antenna's wave propagates and becomes a plane wave in the far-field. Because the test chamber may be significantly smaller than the far-field distance, the emitted signal may not reduce to a plane wave before it arrives at the probe. Block 808 compensates for this phenomenon, accounting for the different path lengths between the probe and the antenna elements.

For example, a fully calibrated phased array antenna system may be used to measure ideal values using the testing chamber. Using a center element as a reference, the other elements' received power can be measured to determine a compensation map. Alternatively, the compensation map may be calculated using theory-based predictions or simulations for an ideal antenna array. This compensation map may be used by block 808 to determine what the antenna pattern will be at far-field ranges.

Block 810 may perform validation on the determined values. For example, the process of blocks 804-808 may be repeated. In another example, the angle of the platform 206 may be adjusted (e.g., by ±1°) and the power may be measured, to confirm that the maximum power is measured at the intend scan angle. The amount of adjustment may be relatively small, for example less than about 2°.

Figure 9:
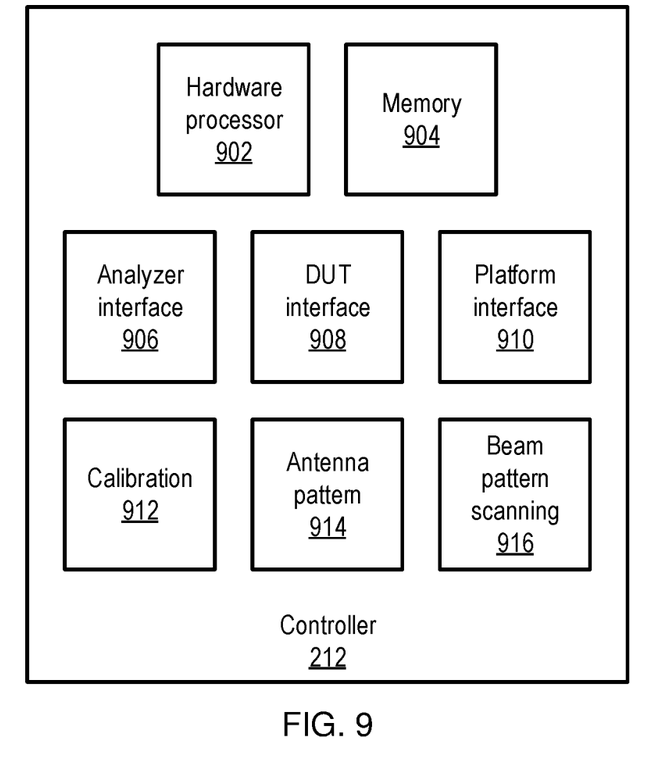
FIG. 9 is a block diagram of a controller that can perform calibration and testing on a phased array antenna system, in accordance with an embodiment of the present invention.

Referring now to FIG. 9, additional detail on the controller 212 is shown. The controller 212 may include a hardware processor 902 and memory 904. In addition, the controller 212 may include interfaces to various other devices in a testing arrangement. In particular, an analyzer interface 906 may communicate with the analyzer 210, a device under test analyzer 908 may communicate with the device under test 204, and platform interface 910 may communicate with the adjustable platform 206. Each interface may communicate by a dedicated connection, or may communicate through a general-purpose communications interface, such as a computer network interface. Each interface may communicate by any appropriate wired or wireless communications medium and protocol.

The controller 212 may include a variety of functional components. These functional components may be implemented as software that is stored in the memory 904 and that is executed by the hardware processor 902. One or more of the functional components may be implemented as one or more discrete hardware components, for example in the form of application-specific integrated chips or field-programmable gate arrays.

The controller 212 may perform calibration 912 of a device under test 204, by communicating with the device under test 204, the adjustable platform 206, and/or the analyzer 210, for example in the manner described above. The controller 212 may also identify an antenna pattern 914 generated by the device under test by communicating with the device under test 204 and the analyzer 210, for example in the manner described above. The controller 212 may further perform beam pattern scanning 916 by communicating with the device under test 204, the adjustable platform 206, and the analyzer 210, for example in the manner described above.

All examples and conditional language recited herein are intended for pedagogical purposes to aid the read in understanding the principles of the invention and the concepts contributed by the inventor to furthering the art and are to be construed as being without limitation to such specifically recited examples and conditions.

Moreover, all statements herein reciting principles, aspects, and embodiments of the present principles, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the present principles. Similarly, it will be appreciated that any flow charts, flow diagrams, state transition diagrams, pseudocode, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read only memory ("ROM") for storing software, random access memory ("RAM"), and non volatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

In the claims hereof, any element expressed as a means for performing a specified function is intended to encompass any way of performing that function including, for example, a) a combination of circuit elements that performs that function or b) software in any form, including, therefore, firmware, microcode or the like, combined with appropriate circuitry for executing that software to perform the function. The present principles as defined by such claims reside in the fact that the functionalities provided by the various recited means are combined and brought together in the manner which the claims call for. It is thus regarded that any means that can provide those functionalities are equivalent to those shown herein.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the present principles may be implemented in various forms of hardware, software, firmware, special purpose processors, or a combination thereof. Preferably, the present principles may be implemented as a combination of hardware and software. Moreover, the software is preferably implemented as an application program tangibly embodied on a program storage device. The application program may be uploaded to, and executed by, a machine comprising any suitable architecture. Preferably, the machine is implemented on a computer platform having hardware such as one or more central processing units (CPU), a random access memory (RAM), and input/output (I/O) interface(s). The computer platform also includes an operating system and microinstruction code. The various processes and functions described herein may either be part of the microinstruction code or part of the application program (or a combination thereof) that is executed via the operating system. In addition, various other peripheral devices may be connected to the computer platform such as an additional data storage device and a printing device.

It is to be further understood that, because some of the constituent system components and method steps depicted in the accompanying Figures are preferably implemented in software, the actual connections between the system components (or the process steps) may differ depending upon the manner in which the present principles are programmed. Given the teachings herein, one of ordinary skill in the related art will be able to contemplate these and similar implementations or configurations of the present principles.

The foregoing is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that those skilled in the art may implement various modifications without departing from the scope and spirit of the invention. Those skilled in the art could implement various other feature combinations without departing from the scope and spirit of the invention.

The invention claimed is:

1. A testing apparatus, comprising:
a chamber having a lining made from a material that is absorptive to radiation at a test wavelength;
an adjustable platform positioned at a first side of the chamber, the adjustable platform being rotatable to change an orientation of a device under test;
a probe positioned at a second side of the chamber opposite to the first side of the chamber, that measures electromagnetic radiation from the device under test; and
a vector network analyzer that communicates with the device under test and the probe to determine calibration information for the device under test.

2. The testing apparatus of claim 1, wherein the adjustable platform comprises a gimbal that sets an orientation of the device under test in two degrees of freedom.

3. The testing apparatus of claim 1, wherein the device under test is a phased array antenna system having a plurality of antenna elements, each having a separate controllable phase.

4. The testing apparatus of claim 3, wherein the calibration information includes a phase calibration value for each element of the phased array antenna system.

5. The testing apparatus of claim 4, wherein the adjustable platform is positioned at a first platform angle different from boresight, with phase values of the plurality of antenna elements being set to generate a beam pattern having a direction that has an angle with a value that is the negative of the first platform angle, for a first measurement.

6. The testing apparatus of claim 5, wherein the platform angle is adjusted to a second platform angle, with the phase values of the plurality of antenna elements being set to generate a beam pattern having a direction having an angle with a value that is the negative of the second platform angle, for a second measurement to validate the first measurement.

7. The testing apparatus of claim 6, wherein the second platform angle differs from the first platform angle by less than two degrees.

8. A calibration method, comprising:
measuring first emissions from a phased array device using a first sub-array pattern dividing elements of the phased array device into first sub-arrays;
calibrating the elements of the phased array device using the measured first emissions;
measuring second emissions from the phased array device using a second sub-array pattern dividing the elements of the phased array device into second sub-arrays, each of the second sub-arrays partially overlapping with at least one of the first sub-arrays; and
calibrating the elements of the phased array device using the measured second emissions.

9. The calibration method of claim 8, wherein measuring the first emissions comprises measuring first emissions from each of the respective first sub-arrays, and wherein measuring the second emissions comprises measuring second emissions from each of the respective second sub-arrays.

10. The calibration method of claim 9, wherein calibrating the elements of the phased array device using the measured first emissions comprises setting a phase calibration value for the elements of each of the first sub-arrays based on a comparison between the measured first emissions for each respective first sub-array to expected emissions for each respective first sub-array.

11. The calibration method of claim 10, wherein calibrating the elements of the phased array device using the measured second emissions is performed after calibrating the elements of the phased array device using the measured first emissions and comprises setting the phase calibration value for the elements of each of the second sub-arrays based on a comparison between the measured second emissions for each respective second sub-array to expected emissions for each respective second sub-array.

12. The calibration method of claim 10, wherein measuring the second emissions further comprises transmitting a signal from the elements of the phased array device using the phase calibration values.

13. The calibration method of claim 8, wherein each first sub-array and each second sub-array includes a respective set of four neighboring elements.

14. The calibration method of claim 8, wherein the second sub-array pattern uses less than all of the elements in the phased array.

15. A method for measuring an antenna pattern, comprising:
determining an excitation matrix for a phased array device by performing a calibration that sets values for each element of the phased array device, using a testing apparatus that is smaller than a far-field distance for an operational wavelength of the phased array device;
determining an array factor that sums each element's excitation;
determining an active element pattern; and
calculating a far-field antenna pattern for the phased array device using the array factor and the active element pattern.

16. The method of claim 15, wherein the array factor is calculated as:

$$AF(\theta, \phi) = \sum_{n=1}^{N}\sum_{m=1}^{M} I_{mn} e^{j(m-1)(kd_x \sin\theta\cos\phi)} e^{j(n-1)kd_y\sin\theta\sin\phi}$$

where $I_{mn}$ is an element of the excitation matrix in row m and column n, $k=2\pi/\lambda$ is the wavenumber of the operational wavelength, $\lambda$ is the operational wavelength, $d_x$ and $d_y$ are inter-element spacings in x and y, respectively, and $\theta$ and $\emptyset$ are far-field angles in spherical coordinates.

17. The method of claim 16, wherein the calibration includes a sub-array—based calibration process that uses multiple different sub-array patterns.

18. The method of claim 16, wherein the calibration uses Hadamard matrices.

19. The method of claim 15, wherein calculating the far-field antenna pattern includes solving for the total pattern (TP):

$$TP=(AF)(AEP)$$

where AF is the array factor and AEP is the active element pattern.

20. The method of claim 15, wherein determining the active element pattern includes determining an ideal antenna pattern by simulation or by measurement of a pre-calibrated phased array device.

* * * * *